US008455285B2

(12) United States Patent
Yun

(10) Patent No.: US 8,455,285 B2
(45) Date of Patent: *Jun. 4, 2013

(54) LASER LIFTOFF STRUCTURE AND RELATED METHODS

(75) Inventor: Feng Yun, Westford, MA (US)

(73) Assignee: Luminus Devices, Inc., Billerica, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/353,504

(22) Filed: Jan. 19, 2012

(65) Prior Publication Data

US 2012/0115268 A1 May 10, 2012

Related U.S. Application Data

(63) Continuation of application No. 12/052,721, filed on Mar. 20, 2008, now Pat. No. 8,110,425.

(60) Provisional application No. 60/919,136, filed on Mar. 20, 2007.

(51) Int. Cl.
*H01L 21/00* (2006.01)

(52) U.S. Cl.
USPC ..................................... 438/47; 257/E33.008

(58) Field of Classification Search
USPC ........................ 438/113, 22, 47, 33
See application file for complete search history.

(56) References Cited

U.S. PATENT DOCUMENTS

| 3,293,513 A | 12/1966 | Biard et al. |
| 3,739,217 A | 6/1973 | Bergh |
| 3,922,706 A | 11/1975 | Kaiser |
| 4,864,370 A | 9/1989 | Gaw et al. |
| 5,073,041 A | 12/1991 | Rastani |
| 5,126,231 A | 6/1992 | Levy |
| 5,132,751 A | 7/1992 | Shibata et al. |
| 5,162,878 A | 11/1992 | Sasagawa et al. |
| 5,359,345 A | 10/1994 | Hunter et al. |
| 5,363,009 A | 11/1994 | Monto |
| 5,376,580 A | 12/1994 | Kish |
| 5,426,657 A | 6/1995 | Vakhshoori |
| 5,486,427 A | 1/1996 | Koskenmaki et al. |
| 5,491,350 A | 2/1996 | Unno et al. |
| 5,528,057 A | 6/1996 | Yanagase |
| 5,600,483 A | 2/1997 | Fan et al. |
| 5,605,488 A | 2/1997 | Ohashi et al. |
| 5,631,190 A | 5/1997 | Negley et al. |
| 5,633,527 A | 5/1997 | Lear |
| 5,724,062 A | 3/1998 | Hunter et al. |
| 5,779,924 A | 7/1998 | Krames et al. |
| 5,793,062 A | 8/1998 | Kish et al. |
| 5,814,839 A | 9/1998 | Hosoba |
| 5,834,331 A | 11/1998 | Razeghi |
| 5,955,749 A | 9/1999 | Joannopoulos et al. |
| 6,071,795 A * | 6/2000 | Cheung et al. ............ 438/458 |
| 6,072,628 A | 6/2000 | Sarayeddine |
| 6,091,085 A | 7/2000 | Lester |
| 6,122,103 A | 9/2000 | Perkins et al. |
| 6,222,207 B1 | 4/2001 | Carter-Cornan et al. |
| 6,265,820 B1 | 7/2001 | Ghosh et al. |
| 6,287,882 B1 | 9/2001 | Chang et al. |
| 6,288,840 B1 | 9/2001 | Perkins et al. |

(Continued)

*Primary Examiner* — Savitr Mulpuri

(74) *Attorney, Agent, or Firm* — Wolf, Greenfield & Sacks, P.C.

(57) ABSTRACT

Light-emitting devices, and related components, systems, and methods associated therewith are provided.

11 Claims, 9 Drawing Sheets

U.S. PATENT DOCUMENTS

| | | |
|---|---|---|
| 6,303,405 B1 | 10/2001 | Yoshida et al. |
| 6,307,218 B1 | 10/2001 | Steigerwald et al. |
| 6,335,548 B1 | 1/2002 | Roberts et al. |
| 6,340,824 B1 | 1/2002 | Komoto |
| 6,388,264 B1 | 5/2002 | Pace |
| 6,403,985 B1 | 6/2002 | Fan et al. |
| 6,410,348 B1 | 6/2002 | Chen |
| 6,410,942 B1 | 6/2002 | Thibeault et al. |
| 6,420,242 B1 | 7/2002 | Cheung et al. |
| 6,426,515 B2 | 7/2002 | Ishikawa |
| 6,448,102 B1 * | 9/2002 | Kneissl et al. .............. 438/46 |
| 6,465,808 B2 | 10/2002 | Lin |
| 6,468,824 B2 | 10/2002 | Chen |
| 6,469,324 B1 | 10/2002 | Wang |
| 6,504,180 B1 | 1/2003 | Heremans et al. |
| 6,517,995 B1 | 2/2003 | Jacobson et al. |
| 6,522,063 B2 | 2/2003 | Chen et al. |
| 6,534,798 B1 | 3/2003 | Scherer et al. |
| 6,559,075 B1 * | 5/2003 | Kelly et al. .............. 438/795 |
| 6,562,701 B2 * | 5/2003 | Ishida et al. .............. 438/479 |
| 6,573,537 B1 | 6/2003 | Steigerwald et al. |
| 6,574,383 B1 | 6/2003 | Erchak et al. |
| 6,593,160 B2 | 7/2003 | Carter-Cornan et al. |
| 6,613,610 B2 | 9/2003 | Iwafuchi et al. |
| 6,614,056 B1 | 9/2003 | Tarsa |
| 6,627,521 B2 | 9/2003 | Furukawa |
| 6,642,618 B2 | 11/2003 | Yagi et al. |
| 6,649,437 B1 | 11/2003 | Yang et al. |
| 6,657,236 B1 | 12/2003 | Thibeault et al. |
| 6,661,028 B2 | 12/2003 | Chen |
| 6,677,173 B2 | 1/2004 | Ota |
| 6,690,268 B2 | 2/2004 | Schofield et al. |
| 6,711,192 B1 | 3/2004 | Chikuma et al. |
| 6,740,906 B2 | 5/2004 | Slater, Jr. et al. |
| 6,742,907 B2 | 6/2004 | Funamoto et al. |
| 6,762,069 B2 | 7/2004 | Huang et al. |
| 6,778,746 B2 | 8/2004 | Charlton et al. |
| 6,784,027 B2 | 8/2004 | Streubel et al. |
| 6,784,463 B2 | 8/2004 | Camras et al. |
| 6,791,117 B2 | 9/2004 | Yoshitake |
| 6,791,119 B2 | 9/2004 | Slater, Jr. et al. |
| 6,791,259 B1 | 9/2004 | Stokes |
| 6,794,684 B2 | 9/2004 | Slater, Jr. et al. |
| 6,800,500 B2 | 10/2004 | Coman |
| 6,812,503 B2 | 11/2004 | Lin |
| 6,818,531 B1 | 11/2004 | Yoo |
| 6,825,502 B2 | 11/2004 | Okazaki et al. |
| 6,828,597 B2 | 12/2004 | Wegleiter et al. |
| 6,828,724 B2 | 12/2004 | Burroughes |
| 6,831,302 B2 | 12/2004 | Erchak et al. |
| 6,847,057 B1 | 1/2005 | Gardner et al. |
| 6,849,558 B2 | 2/2005 | Schaper |
| 6,872,635 B2 | 3/2005 | Hayashi et al. |
| 6,878,969 B2 | 4/2005 | Tanaka |
| 6,891,203 B2 | 5/2005 | Kozawa |
| 6,900,587 B2 | 5/2005 | Seuhiro |
| 6,924,163 B2 | 8/2005 | Okazaki |
| 6,943,379 B2 | 9/2005 | Seuhiro |
| 6,946,683 B2 | 9/2005 | Sano |
| 6,958,494 B2 | 10/2005 | Lin |
| 7,074,631 B2 | 7/2006 | Erchak |
| 7,083,993 B2 | 8/2006 | Erchak |
| 7,084,434 B2 | 8/2006 | Erchak |
| 7,098,589 B2 | 8/2006 | Erchak |
| 7,105,861 B2 | 9/2006 | Erchak et al. |
| 7,153,715 B2 * | 12/2006 | Ueda .............. 438/46 |
| 7,166,871 B2 | 1/2007 | Erchak |
| 7,211,831 B2 | 5/2007 | Erchak |
| 7,262,550 B2 | 8/2007 | Erchak |
| 7,274,043 B2 | 9/2007 | Erchak et al. |
| 7,341,880 B2 | 3/2008 | Erchak et al. |
| 7,344,903 B2 | 3/2008 | Erchak et al. |
| 7,368,309 B2 * | 5/2008 | Lee .............. 438/46 |
| 7,450,311 B2 | 11/2008 | Erchak et al. |
| 7,501,299 B2 * | 3/2009 | Wong et al. .............. 438/31 |
| 7,521,854 B2 | 4/2009 | Erchak |
| 7,559,075 B2 * | 7/2009 | Takagi et al. .............. 725/72 |
| 8,110,425 B2 | 2/2012 | Yun |
| 2002/0096994 A1 | 7/2002 | Iwafuchi et al. |
| 2002/0110172 A1 | 8/2002 | Hasnain et al. |
| 2002/0115265 A1 | 8/2002 | Iwafuchi et al. |
| 2002/0164839 A1 | 11/2002 | Enquist |
| 2003/0032209 A1 | 2/2003 | Yeh et al. |
| 2003/0141507 A1 | 7/2003 | Krames et al. |
| 2003/0141563 A1 | 7/2003 | Wang |
| 2003/0143772 A1 | 7/2003 | Chen |
| 2003/0164679 A1 | 9/2003 | Hamano et al. |
| 2003/0209714 A1 | 11/2003 | Taskar |
| 2003/0222263 A1 | 12/2003 | Choi |
| 2004/0027062 A1 | 2/2004 | Shiang et al. |
| 2004/0033638 A1 | 2/2004 | Bader et al. |
| 2004/0043524 A1 | 3/2004 | Huang et al. |
| 2004/0110856 A1 | 6/2004 | Young et al. |
| 2004/0130263 A1 | 7/2004 | Horng |
| 2004/0144985 A1 | 7/2004 | Zhang et al. |
| 2004/0182914 A1 | 9/2004 | Venugopalan |
| 2004/0259279 A1 | 12/2004 | Erchak et al. |
| 2005/0019971 A1 | 1/2005 | Slater, Jr. |
| 2005/0042845 A1 | 2/2005 | Urbanek |
| 2005/0051787 A1 | 3/2005 | Erchak et al. |
| 2005/0082545 A1 | 4/2005 | Wierer |
| 2005/0087757 A1 | 4/2005 | Erchak et al. |
| 2005/0112886 A1 | 5/2005 | Asakawa |
| 2005/0127375 A1 | 6/2005 | Erchak et al. |
| 2005/0191419 A1 | 9/2005 | Helt |
| 2005/0205883 A1 | 9/2005 | Wierer |
| 2006/0073621 A1 * | 4/2006 | Kneissl et al. .............. 438/21 |
| 2006/0225643 A1 * | 10/2006 | Amano et al. .............. 117/89 |

* cited by examiner

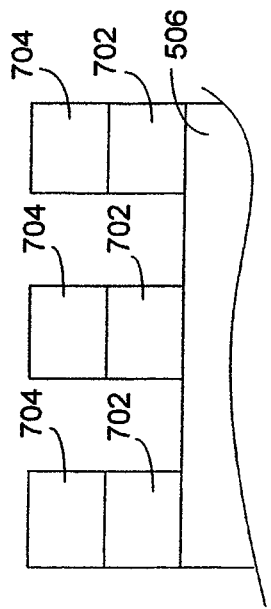
FIG. 13
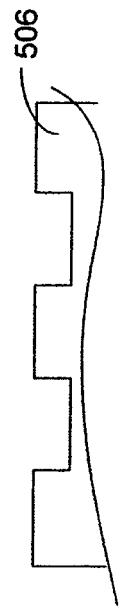
FIG. 14
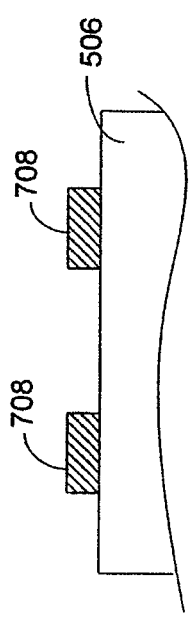
FIG. 16
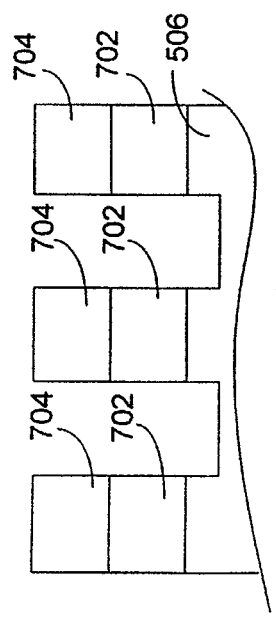
FIG. 15
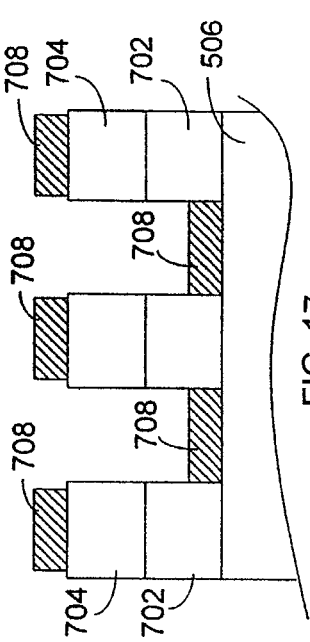
FIG. 17
FIG. 18

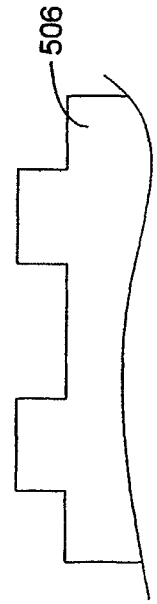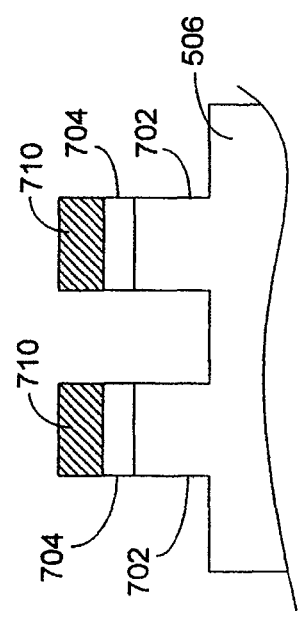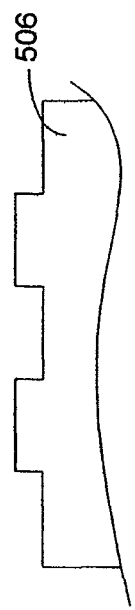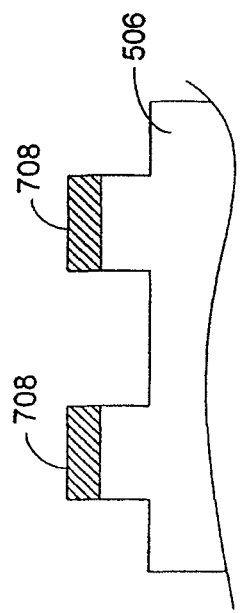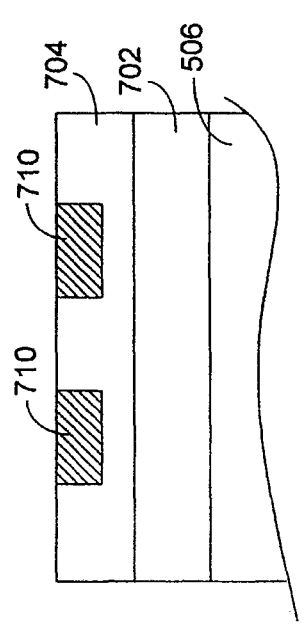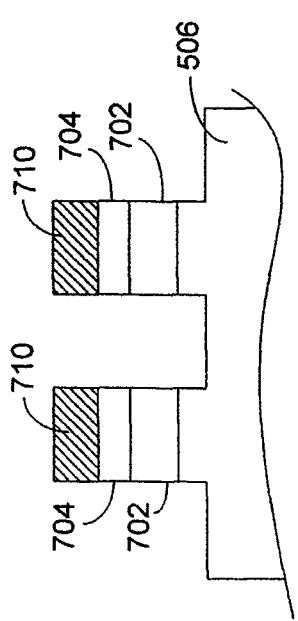

LASER LIFTOFF STRUCTURE AND RELATED METHODS

RELATED APPLICATIONS

This application is a continuation of U.S. patent application Ser. No. 12/052,721, filed Mar. 20, 2008, which claims priority to U.S. Provisional Patent Application Ser. No. 60/919,136, filed Mar. 20, 2007, which are incorporated herein by reference in their entirety.

FIELD

The present embodiments are drawn generally towards light-emitting structures, devices and/or systems, and more specifically to light-emitting structures that can be formed by layer transfer. Specifically, the methods and structures of at least some of the embodiments include laser liftoff related methods and structures.

BACKGROUND

A light-emitting diode (LED) can often provide light in a more efficient manner than an incandescent light source and/or a fluorescent light source. The relatively high power efficiency associated with LEDs has created an interest in using LEDs to displace conventional light sources in a variety of lighting applications. For example, in some instances LEDs are being used as traffic lights and to illuminate cell phone keypads and displays.

Typically, an LED is formed of multiple layers, with at least some of the layers being formed of different materials. In general, the materials and thicknesses selected for the layers influence the wavelength(s) of light emitted by the LED. In addition, the chemical composition of the layers can be selected to promote isolation of injected electrical charge carriers into regions (commonly referred to as quantum wells) for relatively efficient conversion to optical power. Generally, the layers on one side of the junction where a quantum well is grown are doped with donor atoms that result in high electron concentration (such layers are commonly referred to as n-type layers), and the layers on the opposite side are doped with acceptor atoms that result in a relatively high hole concentration (such layers are commonly referred to as p-type layers).

LEDs also generally include contact structures (also referred to as electrical contact structures or electrodes), which are features on a device that may be electrically connected to a power source. The power source can provide current to the device via the contact structures, e.g., the contact structures can deliver current along the lengths of structures to the surface of the device within which energy can be converted into light.

SUMMARY

Light-emitting devices, and related components, systems, and methods associated therewith are provided.

In one aspect, a method of making a light emitting device is provided, the method comprises providing a first multi-layer stack. The first multi-layer stack comprises a substrate, a submount, a high bandgap buffer region between the substrate and the submount, and a sacrificial portion between the buffer region and the submount. The buffer region includes a dislocation reduction region. The method further comprises exposing the sacrificial portion to electromagnetic radiation to at least partially decompose the sacrificial portion; and, removing the substrate and at least part of the buffer region from the first multi-layer stack to form a second multi-layer stack. The substrate and the buffer region are transparent to wavelengths of the electromagnetic radiation.

In one aspect, a method of making a light emitting device is provided, the method comprises providing a first multi-layer stack. The first multi-layer stack comprises a substrate, a submount, a high bandgap buffer region between the substrate and the submount, and a sacrificial portion between the buffer region and the submount. The method further comprises exposing the sacrificial portion to electromagnetic radiation to at least partially decompose the sacrificial portion; and, removing the substrate and at least part of the buffer region from the first multi-layer stack to form a second multi-layer stack including an n-doped region having a thickness of less than 1000 nm at an upper surface of the multi-layer stack. The substrate and buffer layers are transparent to wavelengths of the electromagnetic radiation.

In one aspect, a method of making a light emitting device is provided. The method comprises providing a first multi-layer stack, comprising an AlN substrate, a submount, and a sacrificial portion between the substrate and the submount. The method further comprises exposing the sacrificial portion to electromagnetic radiation to at least partially decompose the sacrificial portion; and, removing the AlN substrate to form a second multi-layer stack.

Other aspects, embodiments and features of the invention will become apparent from the following detailed description of the invention when considered in conjunction with the accompanying figures. The accompanying figures are schematic and are not intended to be drawn to scale. In the figures, each identical or substantially similar component that is illustrated in various figures is represented by a single numeral or notation.

For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

BRIEF DESCRIPTION OF FIGURES

FIG. 13 is a partial cross-sectional view of a multi-layer stack;

FIG. 14 is a partial cross-sectional view of a multi-layer stack;

FIG. 15 is a partial cross-sectional view of a multi-layer stack;

FIG. 16 is a partial cross-sectional view of a multi-layer stack;

FIG. 17 is a partial cross-sectional view of a multi-layer stack;

FIG. 18 is a partial cross-sectional view of a multi-layer stack;

FIG. 19 is a partial cross-sectional view of a multi-layer stack;

FIG. 20 is a partial cross-sectional view of a multi-layer stack;

FIG. 21 is a partial cross-sectional view of a multi-layer stack;

FIG. 22 is a partial cross-sectional view of a multi-layer stack;

FIG. 23 is a partial cross-sectional view of a multi-layer stack; and

FIG. 24 is a partial cross-sectional view of a multi-layer stack.

DETAILED DESCRIPTION

One or more embodiments presented herein include a structure and method that allows for the layer transfer of a light generating layer (e.g., an active region of a light emitting diode and/or laser diode) onto a desired substrate. In some embodiments, a laser lift-off process is performed on a structure that allows for the transfer of thin GaN and/or InGaN layers. In some embodiments, a thin GaN and/or InGaN layer has a thickness of less than about 1 micron (e.g., less than about 750 nm, less than about 500 nm, less than about 250 nm).

In some embodiments, a high bandgap (e.g., greater than about 4 eV, greater than about 5 eV, greater than 6.0 eV) buffer structure, also sometimes known as a wide bandgap buffer structure, may be disposed between a substrate have a high bandgap (e.g., greater than about 4 eV, greater than about 5 eV, greater than 6.0 eV) and a layer to be transferred (e.g., via laser liftoff) to a handle wafer (e.g., like a metal submount). The layer(s) to be transferred from the substrate to the handle wafer can include GaN, InGaN, and/or AlGaN layers. In some embodiments, the layer(s) to be transferred have a thickness of less than about 1.0 micron (e.g., less than 750 nm, less than 500 nm, less than 250 nm). The substrate can include a sapphire substrate or an AlN substrate.

In some embodiments, a high bandgap buffer structure may be absent and the layer(s) to be transferred from the substrate to the handle wafer (e.g., GaN, InGaN, and/or AlGaN layer(s)) may be disposed directly on the high bandgap substrate.

In some embodiments, a laser liftoff process may be performed by transmitting a small wavelength electromagnetic radiation (e.g., a UV light having a wavelength smaller than 250 nm, such as a 248 nm UV laser or lamp) through the high bandgap substrate. In embodiments including a high bandgap buffer, a portion or all of the high bandgap buffer can be transparent to the small wavelength electromagnetic radiation. The small wavelength electromagnetic radiation may be absorbed at the interface with the layers to be transferred (e.g., GaN, InGaN, and/or AlGaN layers). Some embodiments may utilize laser liftoff processes and structures described in commonly-owned U.S. Patent Application Publication Nos. 20050059179 and 20050059178, which are incorporated herein by reference.

Figure 1:
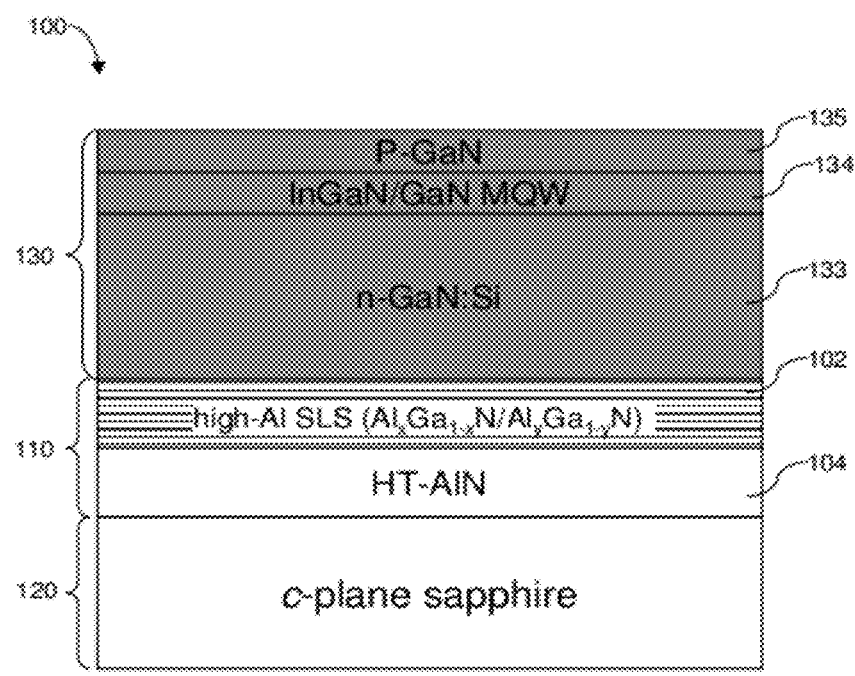
FIG. 1 is a schematic of a wafer structure.

FIG. 1 illustrates a wafer structure 100 including a high bandgap buffer structure 110. The wafer structure 100 includes a substrate 120. Substrate 120 can include a high bandgap substrate, such a sapphire substrate or an AlN substrate (e.g., a c-plane sapphire substrate).

In some embodiments, a high bandgap buffer layer 110 may be disposed (e.g., deposited via chemical vapor deposition, such as with MOCVD) over the substrate 120. In some embodiments, high bandgap buffer layer 110 may include one or more layers. In some embodiments, high bandgap buffer layer 110 can include one or more AlN layers, one or more $Al_xGa_{1-x}N$ layers (with the same or different Al fractions, x), and/or combinations thereof.

The high bandgap buffer 110 can include a layer 104 than may be formed on the substrate 120. In some embodiments, layer 104 is an AlN layer that can be deposited at high temperatures and may have any suitable thickness. Layer 104 can have a thickness greater than 10 nm (e.g., greater than 25 nm, greater than 50 nm). In some embodiments, layer 104 has one or more bandgaps that make the layer transparent to electromagnetic radiation light having a wavelength smaller than 250 nm.

High bandgap buffer 110 can include a dislocation reduction region 102, which can be disposed over layer 104. In some embodiments, the dislocation reduction region has a composition that varies across a thickness of the region. For example, the composition of at least one of the elements in the dislocation reduction region is graded across a thickness of the region. For example, the dislocation reduction region may comprise a nitride-based alloy comprising aluminum and gallium (e.g., $Al_xGa_{1-x}N$), and the concentration of aluminum and/or gallium may be graded. It should be understood that any suitable type of composition variation or grade may be used. For example, the composition may be graded linearly, or step-wise, from a high aluminum and/or low gallium concentration at a lower surface of the region to a low aluminum and/or high gallium concentration at an upper surface of the region.

In some embodiments, dislocation reduction region 102 can include a superlattice structure. In some embodiments, the superlattice structure has greater than about 25 pairs of layers (e.g., greater than about 50 pairs, greater than about 75 pairs, greater than about 100 pairs). In some embodiments, the has less than about 200 pairs of layers (e.g., less than about 150 pairs of layers, less than about 100 pairs of layers). Dislocation reduction region 102 may facilitate the reduction of dislocations due to lattice mismatch with the substrate 120. In some embodiments, dislocation reduction region 102 may reduce the threading dislocation density via strain-induced dislocation motion that can facilitate dislocation annihilation, dislocation masking, and/or via the formation of defect types that do not propagate to the surface.

In some embodiments, the superlattice structure can include a high-Al content superlattice structure. The high-Al content superlattice structure can include an $Al_xGa_{1-x}N/Al_yGa_{1-y}N$ superlattice. In some embodiments, x is greater than about 0.65 (e.g., greater than 0.75, greater about 0.85, greater than about 0.95). In some embodiments, y is greater than about 0.65 (e.g., greater than 0.75, greater about 0.85, greater than about 0.95). In some embodiments, y is greater than or equal to x. In some embodiments, the superlattice structure has one or more bandgaps that make the superlattice structure transparent to electromagnetic radiation light having a wavelength smaller than 250 nm.

Layer(s) 130 may be disposed over the high bandgap buffer 110. Layer(s) 130 can include layers that can serve as device structure layers (e.g., light emitting diode and/or laser diode layers). In one embodiment, layer(s) 130 include one or more p-doped layers, one or more n-doped layers, and/or one or more active layers (e.g., such as one or more quantum wells).

Layer(s) 130 may include a first layer 133. Layer 133 can have a bandgap such that electromagnetic radiation having a wavelength that is transmitted by the substrate 120 and/or the high bandgap buffer 110 is absorbed at the bottom interface of layer 133 (e.g., the interface of layer 133 closer to the substrate 120). Layer 133 can be thin (e.g., can have a thickness less than 1000 nm, less than 750 nm, less than 500 nm, less than 250). Layer 133 can include a thin GaN layer (e.g., can have a thickness less than 1000 nm, less than 750 nm, less than 500 nm, less than 250). Layer 133 can be n and/or p doped to any desired concentration. In one embodiment, layer 133 is an n-doped layer (e.g., a GaN layer) having a doping concentration of about $10^{18}$ cm$^{-3}$.

Layer(s) 130 can include an active layer 134, which can include one or more quantum wells (e.g., an InGaN/GaN multi-quantum well structure). Layer(s) 130 can include a layer 135 that can be disposed over the active layer 134. Layer 135 can include a p-doped layer. In some embodiments, layer 135 can include a GaN layer (e.g., a p-doped GaN layer).

Wafer 100 can then be bonded to a submount wafer. Alternatively a submount may be formed (e.g., electroformed, evaporated) on an exposed surface of the wafer 100 (e.g., over layer 135).

Figure 2:
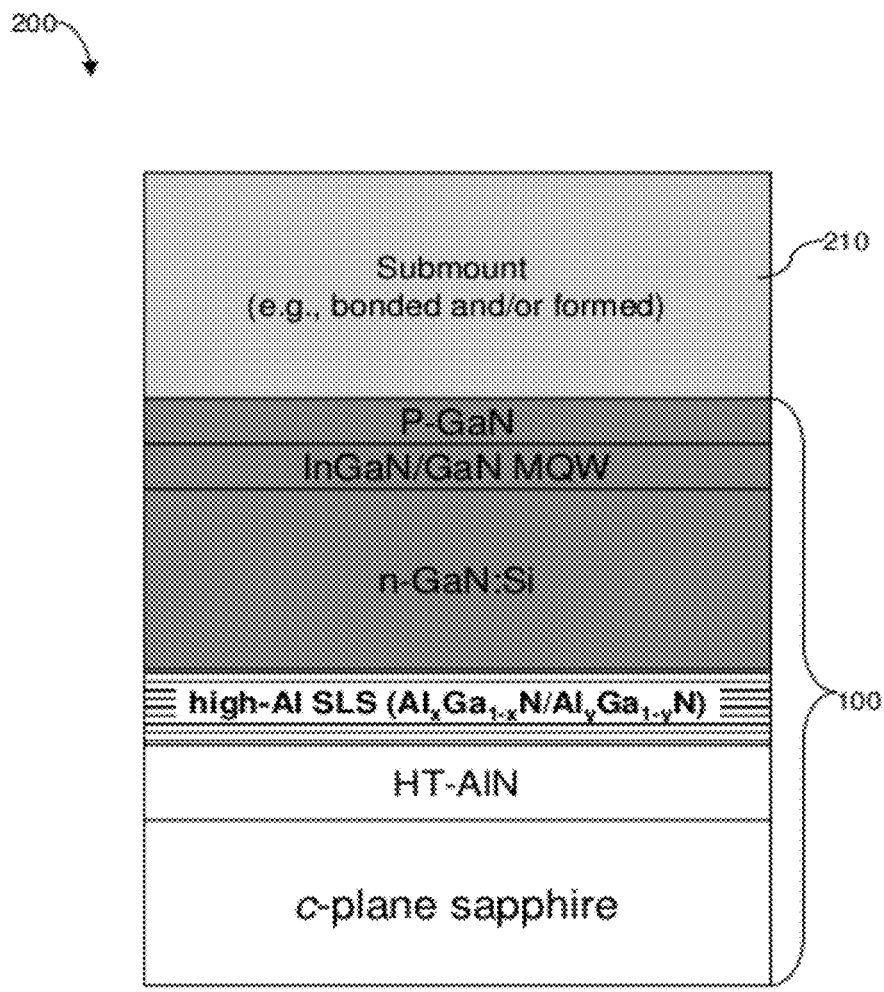
FIG. 2 is a schematic of a wafer structure including a submount.

FIG. 2 illustrates a structure 200 including a submount 210 disposed on wafer structure 100. Part or all of submount 210 can be electrically conductive and/or thermally conductive. In some embodiments, submount 210 can include a metal (e.g., copper, aluminum, copper-tin alloy) submount.

In some embodiments, a submount 210 may be a wafer that is bonded to the wafer structure 100. Submount 210 may be directly bonded to wafer 100. Submount 210 may be bonded to wafer 100 via one or more intermediate bonding layers, such as a metal bonding layer (e.g., a gold tin bonding layer). Bonding may be performed at any suitable temperature. In some embodiments, bonding may be performed at room temperature. In other embodiments, bonding may be performed at an elevated temperature. Pressure may be applied to promote bonding of the wafers. Upon bonding, the bonded pair of wafers may be annealed at a suitable temperature that promotes the strengthening of the bond.

Alternatively, or additionally, submount 210 may be formed via electrodeposition, physical vapor deposition (e.g., evaporation, sputtering), and/or chemical vapor deposition.

Figure 3:
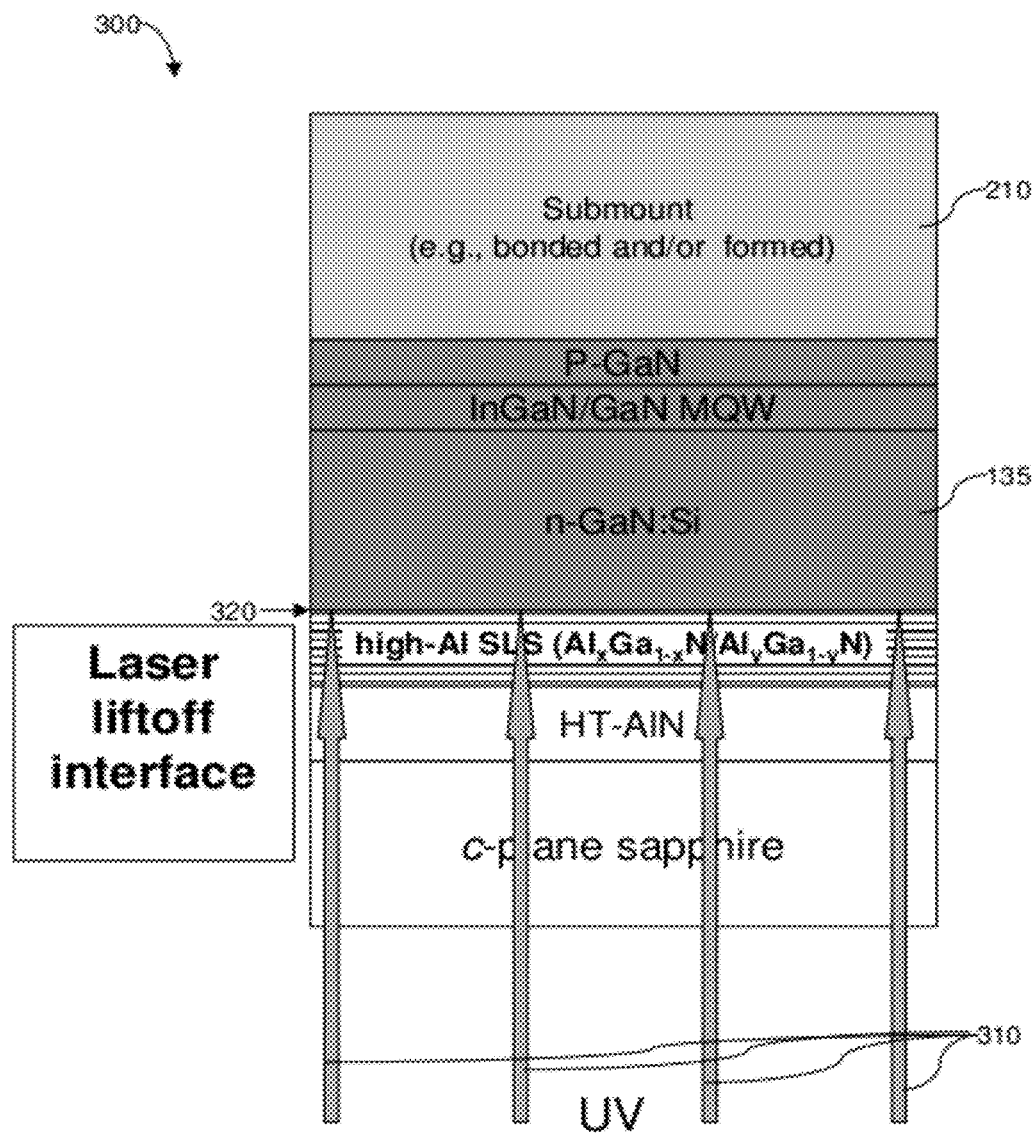
FIG. 3 is a schematic of an intermediate wafer structure formed during a layer transfer process.

FIG. 3 illustrates an intermediate structure of a process that may be used to remove substrate 120 and/or high bandgap buffer layer 110 from layer(s) 130 and submount 210. A process to remove substrate 120 and/or high bandgap buffer layer 110 may include illuminating the backside of substrate 120 with electromagnetic radiation 310 having a wavelength which is not absorbed by the substrate 120. The electromagnetic radiation can be radiation from a laser and/or a lamp. In some embodiments, the electromagnetic radiation can have a wavelength less than 250 nm, for example UV light. The wavelength of the electromagnetic radiation can have a wavelength such that the radiation is absorbed by layer 130, for example at a sacrificial portion (e.g., interface 320) of layer 130. The absorbed radiation can heat up the interface and cause the liquefaction of material. For example, when layer 133 includes a GaN layer, the heat can result in the decomposition of the GaN into nitrogen gas and liquid gallium. Substrate 120 and high bandgap buffer 110 may be detached from structure including layer(s) 130 on submount 210.

Upon layer transfer, the surface of layer 133 may be cleaned with a suitable process (e.g., wet chemical clean) and/or polished. Alternatively, layer 133 may be etched to thin layer 133 further. In some embodiments, the thickness of layer 133 may be precisely defined via a epitaxial deposition process that is used to form buffer 110 and layer(s) 130, as illustrated in FIG. 1. In such a process, the thickness of the transferred layers 130 may be precisely defined and may arbitrarily thin (e.g., less than 1000 nm, less than 750 nm, less than 500 nm, less than 250 nm).

Figure 4:
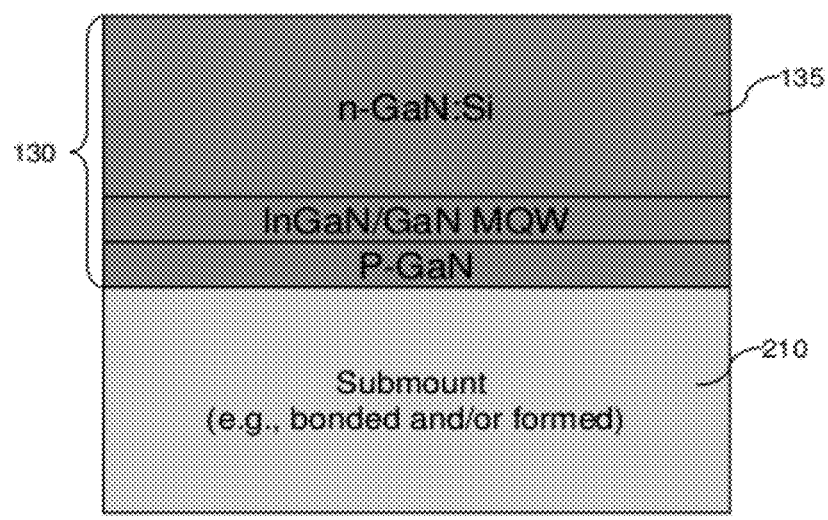
FIG. 4 is a schematic of wafer structure formed after layer transfer.

FIG. 4 illustrates a layer transferred structure 400 including transferred layers 130 disposed over (e.g., directly on) submount 210. It should be appreciated that high performance LED structures on metal bonded and/or electroformed submounts can benefit from the use of a very thin n-GaN layer. The use of a high bandgap buffer (e.g., high-Al content strain relief superlattice) stack, which may be grown on an AlN buffer layer, can facilitate substrate removal and/or simplification the layer transfer process. In some embodiments, the processes do not sacrifice material quality (e.g., does not increase dislocation density). As discussed above, the high bandgap buffer can be removed g to leave a high quality, thin n-GaN layer for cathode contact fabrication. In some embodiments, LED structures grown over a high bandgap buffer (e.g., a high-Al content superlattice structure), can be grown on a AlN layer. The LED structures can include a thin n-GaN layer, and the resulting LED structure can have a high IQE.

Figure 5:
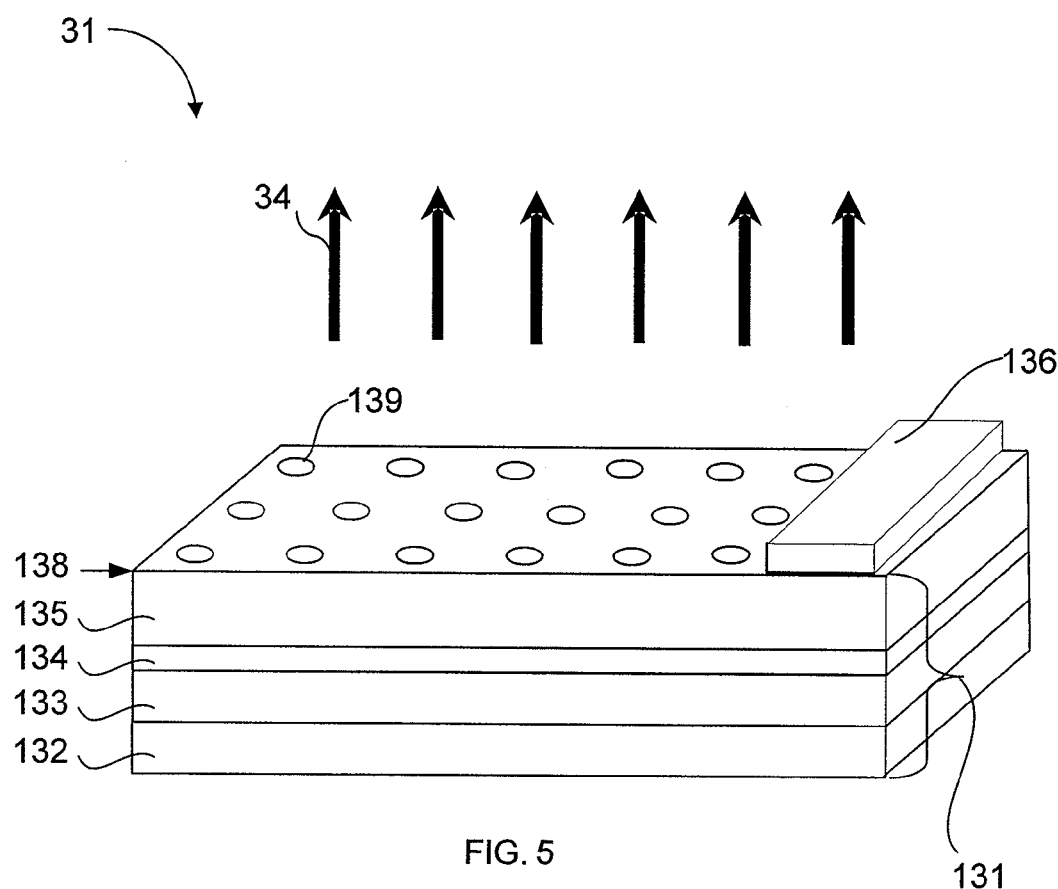
FIG. 5 is a schematic of a light emitting die.

FIG. 5 illustrates an light-emitting diode (LED) die that may be formed on a layer transferred structure (e.g., a layer stack formed by processes described herein), in accordance with one embodiment. It should also be understood that various embodiments presented herein can also be applied to other light-emitting devices, such as laser diodes, and LEDs having different structures.

LED 31 shown in FIG. 5 comprises a multi-layer stack 131 that may be disposed on a support structure, such as a submount, as previously described (e.g., for example using a layer transfer process). The multi-layer stack 131 can include an active region 134 which is formed between n-doped layer(s) 135 and p-doped layer(s) 133. The stack can also include an electrically conductive layer 132 which may serve as a p-side contact, which can also serve as an optically reflective layer. An n-side contact pad 136 is disposed on layer 135. It should be appreciated that the LED is not limited to the configuration shown in FIG. 5, for example, the n-doped and p-doped sides may be interchanged so as to form a LED having a p-doped region in contact with the contact pad 136 and an n-doped region in contact with layer 132. As described further below, electrical potential may be applied to the contact pads which can result in light generation within active region 134 and emission of at least some of the light generated through an emission surface 138. As described further below, openings 139 may be defined in a light-emitting interface (e.g., emission surface 138) to form a pattern that can influence light emission characteristics, such as light extraction and/or light collimation. It should be understood that other modifications can be made to the representative LED structure presented, and that embodiments are not limited in this respect.

The active region of an LED can include one or more quantum wells surrounded by barrier layers. The quantum well structure may be defined by a semiconductor material layer (e.g., in a single quantum well), or more than one semiconductor material layers (e.g., in multiple quantum wells), with a smaller electronic band gap as compared to the barrier layers. Suitable semiconductor material layers for the quantum well structures can include InGaN, AlGaN, GaN and combinations of these layers (e.g., alternating InGaN/GaN layers, where a GaN layer serves as a barrier layer). In general, LEDs can include an active region comprising one or more semiconductors materials, including III-V semiconductors (e.g., GaAs, AlGaAs, AlGaP, GaP, GaAsP, InGaAs, InAs, InP, GaN, InGaN, InGaAlP, AlGaN, as well as combinations and alloys thereof), II-VI semiconductors (e.g., ZnSe, CdSe, ZnCdSe, ZnTe, ZnTeSe, ZnS, ZnSSe, as well as combinations and alloys thereof), and/or other semiconductors. Other light-emitting materials are possible such as quantum dots or organic light-emission layers.

The n-doped layer(s) 135 can include a silicon-doped GaN layer (e.g., having a thickness of about 4000 nm thick) and/or the p-doped layer(s) 133 include a magnesium-doped GaN layer (e.g., having a thickness of about 40 nm thick). The electrically conductive layer 132 may be a silver layer (e.g., having a thickness of about 100 nm), which may also serve as a reflective layer (e.g., that reflects upwards any downward propagating light generated by the active region 134). Furthermore, although not shown, other layers may also be included in the LED; for example, an AlGaN layer may be disposed between the active region 134 and the p-doped layer(s) 133. It should be understood that compositions other than those described herein may also be suitable for the layers of the LED.

As a result of openings 139, the LED can have a dielectric function that varies spatially according to a pattern. The dielectric function that varies spatially according to a pattern can influence the extraction efficiency and/or collimation of light emitted by the LED. In some embodiments, a layer of the LED may have a dielectric function that varies spatially according to a pattern. In the illustrative LED 31, the pattern is formed of openings, but it should be appreciated that the variation of the dielectric function at an interface need not necessarily result from openings. Any suitable way of producing a variation in dielectric function according to a pattern may be used. For example, the pattern may be formed by varying the composition of layer 135 and/or emission surface 138. The pattern may be periodic (e.g., having a simple repeat cell, or having a complex repeat super-cell), or non-periodic. As referred to herein, a complex periodic pattern is a pattern that has more than one feature in each unit cell that repeats in a periodic fashion. Examples of complex periodic patterns include honeycomb patterns, honeycomb base patterns, (2×2) base patterns, ring patterns, and Archimedean patterns. In some embodiments, a complex periodic pattern can have certain holes with one diameter and other holes with a smaller diameter. As referred to herein, a non-periodic pattern is a pattern that has no translational symmetry over a unit cell that has a length that is at least 50 times the peak wavelength of light generated by one or more light-generating portions. Examples of non-periodic patterns include aperiodic patterns, quasi-crystalline patterns (e.g., quasi-crystal patterns having 8-fold symmetry), Robinson patterns, and Amman patterns. A non-periodic pattern can also include a detuned pattern (as described in U.S. Pat. No. 6,831,302 by Erchak, et al., which is incorporated herein by reference). In some embodiments, a device may include a roughened surface. The surface roughness may have, for example, a root-mean-square (rms) roughness about equal to an average feature size which may be related to the wavelength of the emitted light.

In certain embodiments, an interface of a light-emitting device is patterned with openings which can form a photonic lattice. Suitable LEDs having a dielectric function that varies spatially (e.g., a photonic lattice) have been described in, for example, U.S. Pat. No. 6,831,302 B2, entitled "Light Emitting Devices with Improved Extraction Efficiency," filed on Nov. 26, 2003, which is herein incorporated by reference in its entirety. A high extraction efficiency for an LED implies a high power of the emitted light and hence high brightness which may be desirable in various optical systems.

It should also be understood that other patterns are also possible, including a pattern that conforms to a transformation of a precursor pattern according to a mathematical function, including, but not limited to an angular displacement transformation. The pattern may also include a portion of a transformed pattern, including, but not limited to, a pattern that conforms to an angular displacement transformation. The pattern can also include regions having patterns that are related to each other by a rotation. A variety of such patterns are described in U.S. patent application Ser. No. 11/370,220, entitled "Patterned Devices and Related Methods," filed on Mar. 7, 2006, which is herein incorporated by reference in its entirety.

Light 34 may be generated by the LED as follows. The p-side contact layer can be held at a positive potential relative to the n-side contact pad, which causes electrical current to be injected into the LED. As the electrical current passes through the active region, electrons from n-doped layer(s) can combine in the active region with holes from p-doped layer(s), which can cause the active region to generate light. The active region can contain a multitude of point dipole radiation sources that generate light with a spectrum of wavelengths characteristic of the material from which the active region is formed. For InGaN/GaN quantum wells, the spectrum of wavelengths of light generated by the light-generating region can have a peak wavelength of about 445 nanometers (nm) and a full width at half maximum (FWHM) of about 30 nm, which is perceived by human eyes as blue light. The light emitted by the LED may be influenced by any patterned interface through which light passes, whereby the pattern can be arranged so as to influence light extraction and/or collimation.

In other embodiments, the active region can generate light having a peak wavelength corresponding to ultraviolet light (e.g., having a peak wavelength of about 370-390 nm), violet light (e.g., having a peak wavelength of about 390-430 nm), blue light (e.g., having a peak wavelength of about 430-480 nm), cyan light (e.g., having a peak wavelength of about 480-500 nm), green light (e.g., having a peak wavelength of about 500 to 550 nm), yellow-green (e.g., having a peak wavelength of about 550-575 nm), yellow light (e.g., having a peak wavelength of about 575-595 nm), amber light (e.g., having a peak wavelength of about 595-605 nm), orange light (e.g., having a peak wavelength of about 605-620 nm), red light (e.g., having a peak wavelength of about 620-700 nm), and/or infrared light (e.g., having a peak wavelength of about 700-1200 nm).

In certain embodiments, the LED may emit light having a high power (e.g., emitted light output power). As previously described, the high power of emitted light may be a result of a pattern that influences the light extraction efficiency of the LED. For example, the light emitted by the LED may have a total power greater than 0.5 Watts (e.g., greater than 1 Watt, greater than 5 Watts, or greater than 10 Watts). In some embodiments, the light generated has a total power of less than 100 Watts, though this should not be construed as a limitation of all embodiments. The total power of the light emitted from an LED can be measured by using an integrating sphere equipped with spectrometer, for example a SLM12 from Sphere Optics Lab Systems. The desired power depends, in part, on the optical system that the LED is being utilized within. For example, a display system (e.g., a LCD system) may benefit from the incorporation of high brightness LEDs which can reduce the total number of LEDs that are used to illuminate the display system.

The light generated by the LED may also have a high total power flux. As used herein, the term "total power flux" refers to the total power of the emitted light divided by the emission area. In some embodiments, the emitted light has a total power flux greater than 0.03 Watts/mm$^2$ (e.g., greater than 0.05 Watts/mm$^2$, greater than 0.1 Watts/mm$^2$, greater than 0.2 Watts/mm$^2$). However, it should be understood that the LEDs used in systems and methods presented herein are not limited to the above-described power and power flux values.

In some embodiments, the LED may be associated with a wavelength-converting region. The wavelength-converting region may be, for example, a region including one or more phosphor materials and/or quantum dots. In some embodiments, the wavelength-converting region may be disposed over (e.g., directly on) the emission surface of the LED. For example, the wavelength converting region may be disposed on the emission surface of the LED. The wavelength-converting region can absorb light emitted by the light-generating region of the LED and emit light having a different wavelength than that absorbed. In this manner, LEDs can emit light of wavelength(s) (and, thus, color) that may not be readily obtainable from LEDs that do not include wavelength-converting regions.

As used herein, an LED may be an LED die, a partially packaged LED die, or a fully packaged LED die. It should be understood that an LED may include two or more LED dies associated with one another, for example a red-light emitting LED die, a green-light emitting LED die, a blue-light emitting LED die, a cyan-light emitting LED die, or a yellow-light emitting LED die. For example, the two or more associated LED dies may be mounted on a common package. The two or more LED dies may be associated such that their respective light emissions may be combined to produce a desired spectral emission. The two or more LED dies may also be electrically associated with one another (e.g., connected to a common ground).

As previously described, the structures presented herein may be used in combination with a layer transfer process, such as a laser liftoff process. A laser lift-off process is described in US Patent Publication 2004/0259279, filed on Mar. 5, 2004, which is hereby incorporated by reference in its entirety.

Figure 6:
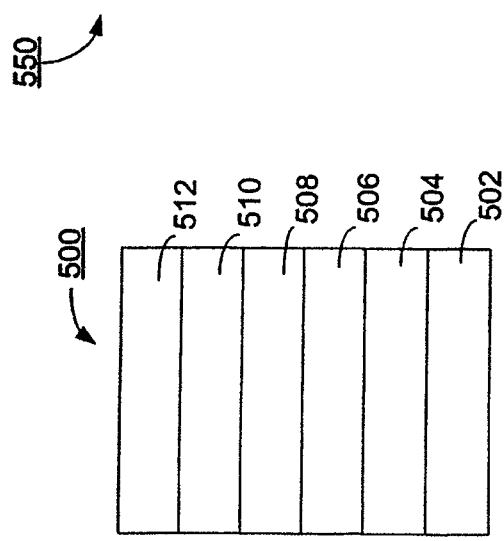
FIG. 6 is a cross-sectional view of a multi-layer stack.

FIG. 6 shows a wafer 500 containing a layer stack of material (e.g., and LED layer stack) deposited on a substrate (e.g., sapphire, compound semiconductor, zinc oxide, silicon carbide, silicon) 502. Such wafers are commercially available. Exemplary commercial suppliers include Epistar Corporation, Arima Optoelectronics Corporation and South Epitaxy Corporation. On substrate 502 are disposed, consecutively, a buffer layer 504 (e.g., a nitride-containing layer, such as a GaN layer, an AlN layer, an AlGaN layer, a superlattice structure as discussed above), an n-doped semiconductor layer (e.g., an n-doped Si:GaN) layer 506, a current spreading layer 508 (e.g., an AlGaN/GaN heterojunction or superlattice), a light-emitting region 510 (e.g., an InGaN/GaN multi-quantum well region), and a semiconductor layer 512 (e.g., a p-doped Mg:GaN layer). Wafer 500 generally has a diameter of at least about two inches (e.g., from about two inches to about 12 inches, from about two inches to about six inches, from about two inches to about four inches, from about two inches to about three inches).

Figure 7:
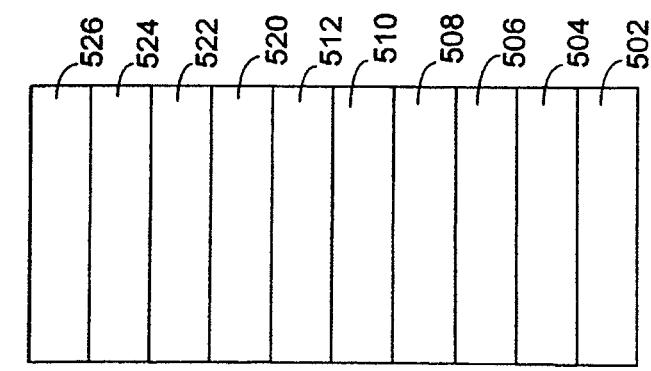
FIG. 7 is a cross-sectional view of a multi-layer stack.

FIG. 7 shows a multi-layer stack 550 including layers 502, 504, 506, 508, 510 and 512, as well as layers 520, 522, 524 and 526, which are generally formed of materials capable of being pressure and/or heat bonded as described below. For example, layer 520 can be a nickel layer (e.g., electron-beam evaporated), layer 522 can be a silver layer (e.g., electron-beam evaporated), layer 524 can be a nickel layer (e.g., electron-beam evaporated), and layer 526 can be a gold layer (e.g., electron-beam evaporated). In some embodiments, layer 520 can be a relatively thin layer, and layer 524 can be a relatively thick layer. Layer 524 can act, for example, as diffusion barrier to reduce the diffusion of contaminants (e.g., gold) into layers 520, 522 and/or 524 itself. After deposition of layers 520, 522, 524 and 526, multi-layer stack 550 can be treated to achieve an ohmic contact. For example, stack 550 can be annealed (e.g., at a temperature of from about 400° C. to about 600° C.) for a period of time (e.g., from about 30 seconds to about 300 seconds) in an appropriate gas environment (e.g., nitrogen, oxygen, air, forming gas).

Figure 8:
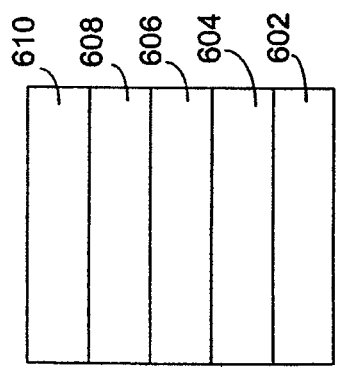
FIG. 8 is a cross-sectional view of a multi-layer stack.

FIG. 8 shows a multi-layer stack 600 that includes a submount (e.g., germanium (such as polycrystalline germanium), silicon (such as polycrystalline silicon), silicon-carbide, copper, copper-tungsten, diamond, nickel-cobalt) 602 having layers 604, 606, 608 and 610 deposited thereon. Submount 602 can be formed, for example, by sputtering or electroforming. Layer 604 is a contact layer and can be formed, for example, from aluminum (e.g., electron evaporated). Layer 606 is a diffusion barrier and can be formed, for example, from Ni (e.g. electron evaporated). Layer 608 can be a gold layer (e.g., electron-beam evaporated), and layer 610 can be a AuSn bonding layer (e.g., thermal evaporated, sputtered) onto layer 608. After deposition of layers 604, 606, 608 and 610, multi-layer stack 600 can be treated to achieve an ohmic contact. For example, stack 600 can be annealed (e.g., at a temperature of from about 350° C. to about 500° C.) for a period of time (e.g., from about 30 seconds to about 300 seconds) in an appropriate gas environment (e.g., nitrogen, oxygen, air, forming gas).

Figure 9:
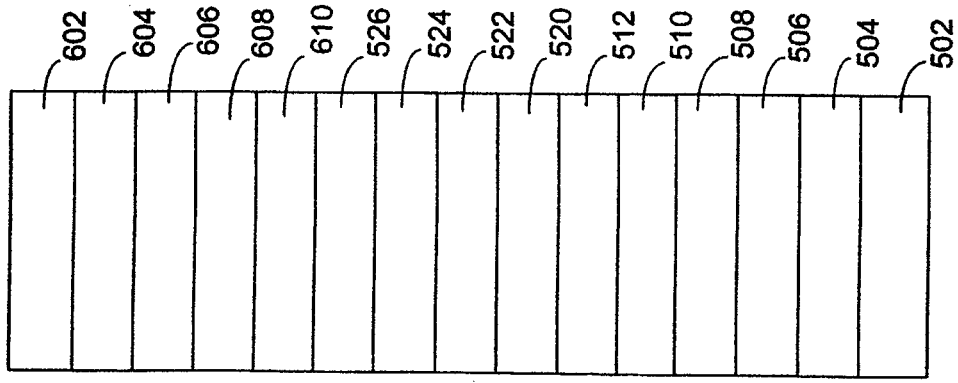
FIG. 9 is a cross-sectional view of a multi-layer stack.

FIG. 9 shows a multi-layer stack 650 formed by bonding together layers 526 and 610 (e.g., using a solder bond, using a eutectic bond, using a peritectic bond). Layers 526 and 610 can be bonded, for example, using thermal-mechanical pressing. As an example, after contacting layers 526 and 610, multi-layer stack 650 can be put in a press and pressurized (e.g., using a pressure of up to about 5 MPa, up to about 2 MPa) heated (e.g., to a temperature of from about 200° C. to about 400° C.). Stack 650 can then be cooled (e.g., to room temperature) and removed from the press.

Figure 10:
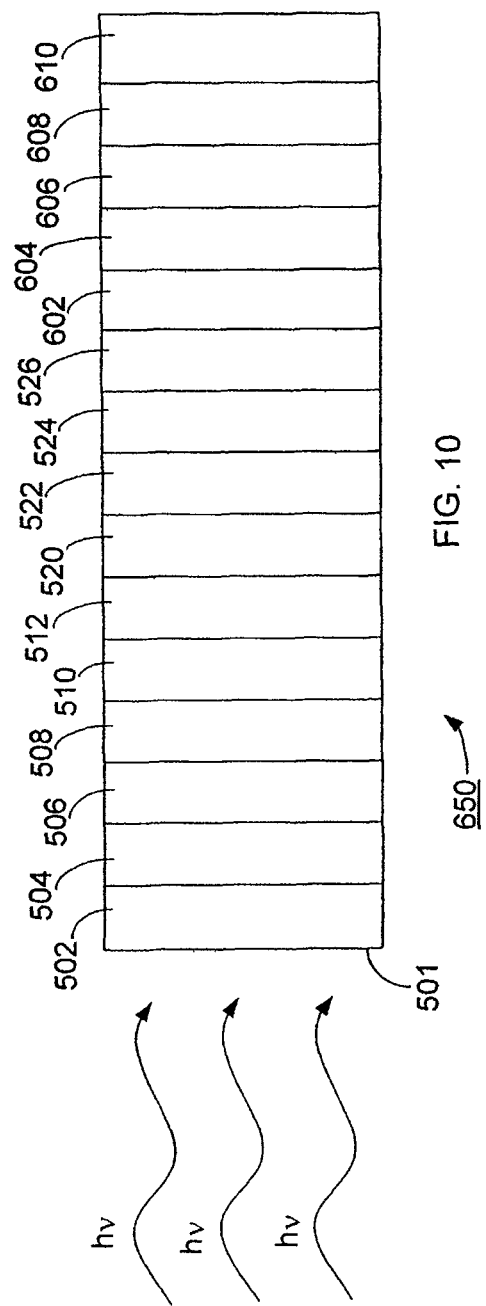
FIG. 10 depicts a side view of a substrate removal process.

Substrate 502 and buffer layer 504 are then at least partially removed from stack 650. In general, this can be achieved using any desired methods. For example, as shown in FIG. 10, in some embodiments, substrate 502 is removed by exposing stack 650 (e.g., through surface 501 of substrate 502) to electromagnetic radiation at an appropriate wavelength to partially decompose layer 504 and/or layer 506. It is believed that this results in local heating of layer 504 and/or 506, resulting in the partial decomposition of the material of layer 504 adjacent the interface of layer 504 and substrate 502 and/or the partial decomposition of the material of layer 506 adjacent the interface of layer 506 and layer 504, thereby allowing for the removal of substrate 502 from stack 650 (see discussion below).

For example, in embodiments in which layer 504 and/or 506 is formed of gallium nitride, it is believed that constituents including gallium and gaseous nitrogen are formed. In some embodiments, stack 650 can be heated during exposure of surface 501 to the electromagnetic radiation (e.g., to reduce strain within stack 650). Stack 650 can be heated, for example, by placing stack 650 on a hot plate and/or by exposing stack 650 to an additional laser source (e.g. a CO2 laser). Heating stack 650 during exposure of surface 501 to electromagnetic radiation can, for example, reduce (e.g., prevent)

liquid gallium from re-solidifying. This can reduce the build up of strain within stack 650 which can occur upon the re-solidification of the gallium In certain embodiments, after exposure to the electromagnetic radiation, residual gallium is present and keeps substrate 502 bonded in stack 650. In such embodiments, stack 650 can be heated to above the melting temperature of gallium to allow substrate 502 to be removed from the stack. In certain embodiments, stack 650 may be exposed to an etchant (e.g., a chemical etchant, such as HCl) to etch the residual gallium and remove substrate 502. Other methods of removing the residual gallium (e.g., physical methods) may also be used.

As an example, in certain embodiments, surface 501 is exposed to laser radiation including the absorption wavelength of layer 504 and/or layer 506 (e.g., about 248 nanometers, about 355 nanometers). Laser radiation processes are disclosed, for example, in U.S. Pat. Nos. 6,420,242 and 6,071,795, which are hereby incorporated by reference. The multilayer stack can then heated to above the melting point of gallium, at which point substrate 502 and buffer layer 504 can be removed from the stack by applying a lateral force to substrate 502 (e.g., using a cotton swab).

In some embodiments, multiple portions of surface 501 are simultaneously exposed to the electromagnetic radiation. In certain embodiments, multiple portions of surface 501 are sequentially exposed to electromagnetic radiation. Combinations of simultaneous and sequential exposure can be used. Further, the electromagnetic radiation can be exposed on surface 501 in the form of a pattern (e.g., a serpentine pattern, a circular pattern, a spiral pattern, a grid, a grating, a triangular pattern, an elementary pattern, a random pattern, a complex pattern, a periodic pattern, a nonperiodic pattern). In some embodiments, the electromagnetic radiation can be rastered across one or more portions of surface 501. In certain embodiments, surface 501 is exposed to overlapping fields of electromagnetic radiation.

In some embodiments, the electromagnetic radiation passes through a mask before reaching surface 501. As an example, the electromagnetic radiation can pass through an optical system that includes a mask (e.g., a high thermal conductivity mask, such as a molybdenum mask, a copper-beryllium mask) before reaching surface 501. In some embodiments, the mask is an aperture (e.g., for truncating or shaping the beam). The optical system can include, for example, at least two lenses having the mask disposed therebetween. As another example, the mask can be formed as a pattern of material on surface 501, with the mask leaving certain portions of surface 501 exposed and some portions of surface 501 unexposed. Such a mask can be formed, for example, via a lithography process.

In some embodiments, the electromagnetic radiation can be rastered across one or more portions of the mask. Without wishing to be bound by theory, it is believed that reducing at least one dimension of the region on surface 501 exposed to electromagnetic radiation within a given area of surface 501 can limit undesired crack propagation, such as crack propagation into layer 504, layer 506 or other layers of stack 650 during removal of substrate 502, while still allowing for crack propagation at the desired layer transfer interface (e.g., the interface between layer 504 and 506, or the interface between substrate 502 and buffer layer 504). It is believed that, if the size of the feature of the electromagnetic radiation on surface 501 is too large, then a gaseous bubble (e.g., a nitrogen bubble) may form that can create a localized pressure that can cause undesired cracking. For example, in embodiments in which surface 501 is exposed to laser radiation that forms a spot or a line on surface 501, at least one dimension of the spot or line can be a maximum of at most about one millimeter (e.g., at most about 500 microns, at most about 100 microns, at most about 25 microns, at most about 10 microns). In some embodiments, the spot size is from about five microns to about one millimeter (e.g., from about five microns to about 100 microns, from about five microns to about 25 microns, from about five microns to about 10 microns).

In certain embodiments, stack 650 is vibrated while surface 501 is exposed to the electromagnetic radiation. Without wishing to be bound by theory, it is believed that vibrating stack 650 while exposing stack 650 to the electromagnetic radiation can enhance crack propagation along the interface between layer 504 and substrate 502. Generally, the conditions are selected to limit the propagation of cracks into the layer that is to be transferred (e.g., so that substantially no cracks propagate into the rest of stack 650).

After removal of substrate 502 and at least some of buffer layer 504, a portion of buffer layer 504 typically remains on at least a portion of the surface of layer 506. A residue of material from substrate 502 (e.g., containing aluminum and/or oxygen) can also be present on the remaining portion of buffer layer 504 and/or on the surface of layer 506. It is generally desirable to remove the remaining portions of buffer layer 504 and any residue from substrate 502, to expose the surface of layer 506, and to clean the exposed surface of layer 506 because layer 506 (which is typically formed of an n-doped semiconductor material) can exhibit good electrical properties (e.g., desirable contact resistance) for subsequent formation of an electrical contact. One or more process steps are usually used to remove any residue and/or remaining portion of buffer layer 504 present, and to clean the surface of layer 506 (e.g., to remove impurities, such as organics and/or particles). The process(es) can be performed using a variety of techniques and/or combinations of techniques. Examples include chemical-mechanical polishing, mechanical polishing, reactive ion etching (e.g., with a substantially chemically etching component), physical etching, and wet etching. Such methods are disclosed, for example, in Ghandhi, S., VLSI Fabrication Principles: Silicon & Gallium Arsenide (1994), which is hereby incorporated by reference.

Often, when substrate 502 is removed, the amount of strain in stack 650 (e.g., due to the lattice mismatch and/or thermal mismatch between the layers in stack 650) can change. For example, if the amount of strain in stack 650 is decreased, the peak output wavelength of region 510 can change (e.g., increase). As another example, if the amount of strain in stack 650 is increased, the peak output wavelength of region 510 can change (e.g., decrease).

To limit undesired cracking during removal of substrate 502, in some embodiments, consideration is given to the coefficient of thermal expansion of both substrate 502, the coefficient of thermal expansion of submount 602, the combined thickness of layers 504, 506, 508, 510, and 512, and/or the coefficient of thermal expansion of one or more of layers 504, 506, 508, 510, and 512. As an example, in some embodiments, substrate 502 and submount 602 are selected so that the coefficient of thermal expansion of submount 602 differs from a coefficient of thermal expansion of substrate 502 by less than about 15% (e.g., less than about 10%, less than about 5%). As another example, in certain embodiments, substrate 502 and submount 602 are selected so that the thickness of submount 602 is substantially greater than the thickness of substrate 502. As an additional example, in some embodiments, semiconductor layers 504, 506, 508, 510, 512 and submount 602 are selected so that the coefficient of thermal expansion of submount 602 differs from a coefficient of thermal expansion of one or more of layers 504, 506, 608, 510, and 512 by less than about 15% (e.g., less than about 10%, less than about 5%).

In general, substrate 502 and submount 602 can have any desired thickness. In some embodiments, substrate 502 is at most about five millimeters (e.g., at most about three millimeters, at most about one millimeter, about 0.5 millimeter) thick. In certain embodiments, submount 602 is at most about 10 millimeters (e.g., at most about five millimeters, at most about one millimeter, about 0.5 millimeter) thick. In some embodiments, submount 602 is thicker than substrate 502, and, in certain embodiments, substrate 502 is thicker than submount 602.

After cleaning the surface of layer 506, the thickness of layer 506 can be reduced to a desired final thickness for use in the light-emitting device. This can be achieved, for example, using a mechanical etching process, alone or in combination with an etching process. In some embodiments, after etching/cleaning the exposed surface of layer 506, the surface of layer 506 has a relatively high degree of flatness (e.g., a relatively high degree of flatness on the scale of the lithography reticle to be used). As an example, in some embodiments, after etching/cleaning the exposed surface of layer 506, the surface of layer 506 has a flatness of at most about 10 microns per 6.25 square centimeters (e.g., at most about five microns per 6.25 square centimeters, at most about one micron per 6.25 square centimeters). As another example, in certain embodiments, after etching/cleaning the exposed surface of layer 506, the surface of layer 506 has a flatness of at most about 10 microns per square centimeter (e.g., at most about five microns per square centimeter, at most about one microns per square centimeter). In certain embodiments, after etching/cleaning the exposed surface of layer 506, the surface of layer 506 has an RMS roughness of at most about 50 nanometers (e.g., at most about 25 nanometers, at most about 10 nanometers, at most about five nanometers, at most about one nanometer).

Figure 11:
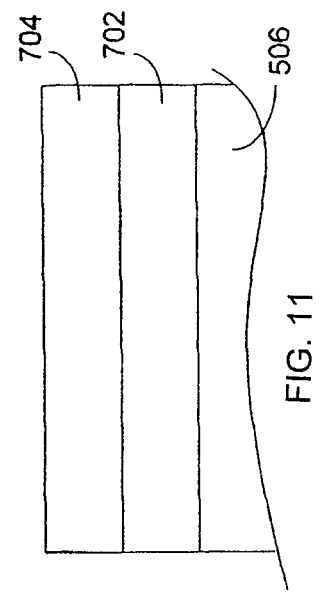
FIG. 11 is a partial cross-sectional view of a multi-layer stack.

In some embodiments, prior to forming a dielectric function that varies spatially according to a pattern (e.g., for a light emitting device that includes a pattern) in the surface of layer 506, the exposed surface of layer 506 may be too rough and/or insufficiently flat to use nanolithography to form the pattern with sufficient accuracy and/or reproducibility. To enhance the ability to accurately and/or reproducibly form the pattern in the surface of layer 506, the nanolithography process may include depositing a planarization layer on the surface of layer 506 and a lithography layer on the surface of the planarization layer. For example, FIG. 11 shows an embodiment in which a planarization layer 702 is disposed on the surface of layer 506, and a lithography layer 704 is disposed on the surface of layer 702, an exposed surface 505 of layer 506 may be relatively rough (e.g., RMS roughness of about 10 nanometers or more) after cleaning/etching layer 506. In some embodiments, planarization layer 702 is formed of multiple layers (e.g., of the same material) that are sequentially deposited.

Examples of materials from which planarization layer 702 can be selected include polymers (e.g., DUV-30J from Brewer Sciences, anti-reflection coatings, high viscosity formable polymers), and examples of materials from which lithography layer 704 can be selected include UV-curable polymers (e.g., low viscosity MonoMat™ available from Molecular Imprints, Inc.). Layers 702 and 704 can be formed using any desired technique, such as, for example, spin coating, vapor deposition, and the like.

Layer 702 can be, for example, at least about 100 nanometers thick (e.g., at least about 500 nanometers thick) and/or at most about five microns thick (e.g., at most about one micron thick). Layer 704 can be, for example, at least about one nanometer thick (e.g., at least about 10 nanometers thick) and/or at most about one micron thick (e.g., at most about 0.5 micron thick).

Figure 12:
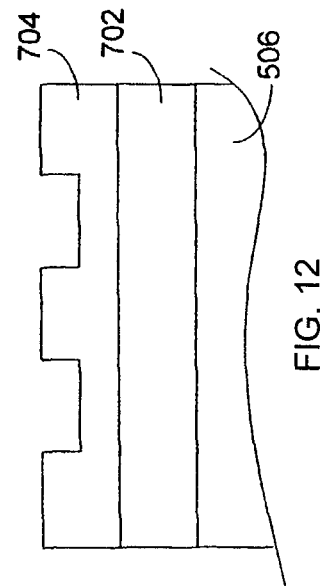
FIG. 12 is a partial cross-sectional view of a multi-layer stack.

A mold that defines a portion of the desired pattern is then pressed into lithography layer and (typically with heating or UV-curing of the mold and/or layer 704), and stepped across the surface of layer 704 in a portion-by-portion manner to form indentions in layer 704 (FIG. 12) that correspond to the desired pattern in the surface of layer 506. In some embodiments, a single step covers the entire wafer (e.g., full wafer nanolithography techniques). Layer 704 is then etched (e.g., using reactive ion etching, wet etching) to expose portions of the surface of layer 702 corresponding to what were the indented portions of layer 704 (FIG. 13). Examples of such imprint/etch processes are disclosed, for example, in U.S. Pat. No. 5,722,905, and Zhang et al., *Applied Physics Letters*, Vol. 83, No. 8, pp. 1632-34, both of which are hereby incorporated by reference. Typically, the pattern in layer 704 also leaves regions for depositing n-contacts later on in the process flow. In alternate embodiments, other techniques (e.g., x-ray lithography, deep ultraviolet lithography, extreme ultraviolet lithography, immersion lithography, interference lithography, electron beam lithography, photolithography, microcontact printing, self-assembly techniques) may be used to create the pattern in layer 704.

As shown in FIG. 14, patterned layer 704 is used as a mask to transfer the pattern into the planarization layer 702 (e.g., dry etching, wet etching). An example of a dry etching method is reactive ion etching. Referring to FIG. 15, layers 702 and 704 are subsequently used as a mask to transfer the pattern into the surface of layer 506 (e.g., using dry etching, wet etching). As shown in FIG. 16, following etching of layer 506, the layers 702 and 704 are removed (e.g., using an oxygen-based reactive ion etch, a wet solvent etch).

Referring to FIG. 17, in some embodiments, the process can include, disposing a material 708 (e.g., a metal, such as aluminum, nickel, titanium, tungsten) in the etched portions of layers 702 and 704 (e.g., by evaporation) and on the surface of layer 704. As shown in FIG. 18, layers 702 and 704 are then etched (e.g., using reactive ion etching, wet etching), leaving behind etch-resistant material 708 on the surface of layer 506, which can serve as a mask for etching the pattern into the surface of layer 506 (FIG. 19). Referring to FIG. 20, etch resistant material 708 can then be removed (e.g., using dry etching, wet etching).

In some embodiments, the process can include, after forming the indents in layer 704, disposing (e.g., spin coating) an etch resistant material (e.g., a Si-doped polymer) 710 on the surface of layer 704 and in the indents in layer 704, and material 710 is then etched back (e.g., using dry etching) so that to expose the surface of layer 704 while maintaining the etch-resistant material in the indents in layer 704 (FIG. 21). As shown in FIG. 22, portions of layers 702 and 704 are then etched (e.g., using reactive ion etching, dry etching, wet etching), leaving behind etch-resistant material 710 and the portions of layers 702 and 704 under material 708, which serve as a mask for etching the pattern into the surface of layer 506 (FIG. 23). Referring to FIG. 24, the remaining portions of layers 702 and 704, as well as etch resistant material 708, can then be removed (e.g., using reactive ion etching, dry etching, wet etching). In some embodiments, removing layer 708 can involve the use of a plasma process (e.g., a fluorine plasma process).

After the pattern has been transferred to n-doped layer 506, a layer of wavelength converting material (e.g., a material including one or more phorphors and/or one or more types of quantum dots) can optionally be disposed (e.g., spin-coated) onto the patterned surface of n-doped layer 506. In some embodiments, a wavelength converting material can conformally coat the patterned surface (coat with substantially no voids present along the bottoms and sidewalls of the openings in the patterned surface). Alternatively, a layer of encapsulant material can be disposed on the surface of patterned n-doped layer 506 (e.g. by CVD, sputtering, suspension by liquid binder that is subsequently evaporated). In some embodiments, the encapsulant can contain one or more phosphor materials and/or one or more types of quantum dots. In some embodiments, a wavelength converting material can be compressed to achieve thickness uniformity less than about 20%, less than about 15%, less than about 10%, less than about 5%, or less than about 2% of the average thickness of the wavelength converting material. In some embodiments, the wavelength converting material-containing encapsulant can conformally coat the patterned surface.

After the dielectric function pattern has been created in the n-doped layer 506, individual LED dice can be cut from the wafer. Once wafer processing and wafer testing is complete, individual LED dice are separated and prepared for packaging and testing. A sidewall passivation step and/or a pre-separation deep mesa etching step may be used to reduce potential damage to the electrical and/or optical properties of the patterned LED incurred during wafer cutting. The individual LEDs can be any size up to the size of the wafer itself, but individual LEDs are typically square or rectangular, with sides having a length between about 0.5 mm to 5 mm. To create the dice, standard photolithography is used to define the location of contact pads on the wafer for energizing the device, and ohmic contacts are evaporated (e.g. using electron beam evaporation) onto the desired locations.

If an LED die is packaged, the package should generally be capable of facilitating light collection while also providing mechanical and environmental protection of the die. For example, a transparent cover can be packaged on the LED die to protect the patterned surface 506 when an encapsulant is not used. The cover slip is attached to supports using a glassy frit that is melted in a furnace. The opposite ends of the supports are connected using a cap weld or an epoxy for example. Supports are typically Ni-plated to facilitate welding to an Au plated surface of the package. It believed that the absence of an encapsulant layer allows higher tolerable power loads per unit area in the patterned surface LED. Degradation of the encapsulant can be a common failure mechanism for standard LEDs and is avoided not using an encapsulant layer.

Because the LEDs are cut from a large area flat wafer, their light output per area does not decrease with area. Also, because the cross-section of an individual LEDs cut from a wafer is only slightly larger than the light-emitting surface area of the LED, many individual, and separately addressable LEDs can be packed closely together in an array. If one LED does not function (e.g., due to a large defect), then it does not significant diminish the performance of the array because the individual devices are closely packed.

While certain embodiments have been described, other embodiments are possible.

As an example, while certain thickness for a light-emitting device and associated layers are discussed above, other thicknesses are also possible. In general, the light-emitting device can have any desired thickness, and the individual layers within the light-emitting device can have any desired thickness. Typically, the thicknesses of the layers within multi-layer stack are chosen so as to increase the spatial overlap of the optical modes with light generating region (e.g., active region), to increase the output from light generated in light generating region.

Exemplary thicknesses for certain layers in a light-emitting device include the following. In some embodiments, layer 135 can have a thickness of at least about 100 nm (e.g., at least about 200 nm, at least about 300 nm, at least about 400 nm, at least about 500 nm) and/or at most about 10 microns (e.g., at most about five microns, at most about three microns, at most about one micron). In certain embodiments, layer 133 has a thickness of at least about 10 nm (e.g., at least about 25 nm, at least about 40 nm) and/or at most about one micron (e.g., at most about 500 nm, at most about 100 nm). In some embodiments, layer 132 has a thickness of at least about 10 nm (e.g., at least about 50 nm, at least about 100 nm) and/or at most about one micron (e.g., at most about 500 nm, at most about 250 nm). In certain embodiments, light-generating region 134 has a thickness of at least about 10 nm (e.g., at least about 25 nm, at least about 50 nm, at least about 100 nm) and/or at most about 500 nm (e.g., at most about 250 nm, at most about 150 nm).

As an example, while a light-emitting diode has been described, other light-emitting devices having the above-described features (e.g., patterns, processes) can be used. Such light-emitting devices include lasers and optical amplifiers. As another example, a current spreading layer can be a separate layer from the n-doped layer, in some embodiments, a current spreading layer can be integral with (e.g., a portion of) layer 135. In such embodiments, the current spreading layer can be a relatively highly n-doped portion of layer 135 or a heterojunction between (e.g. AlGaN/GaN) to form a 2 D electron gas.

As a further example, while certain semiconductor materials have been described, other semiconductor materials can also be used. In general, any semiconductor materials (e.g., III-V semiconductor materials, organic semiconductor materials, silicon) can be used that can be used in a light-emitting device. Examples of other light-generating materials include InGaAsP, AlInGaN, AlGaAs, InGaAlP. Organic light-emitting materials include small molecules such as aluminum tris-8-hydroxyquinoline ($Alq_3$) and conjugated polymers such as poly[2-methoxy-5-(2-ethylhexyloxy)-1,4-vinylenephenylene] or MEH-PPV.

As an additional example, while large area LEDs have been described, the LEDs can also be small area LEDs (e.g., LEDs smaller than the standard about 300 microns on edge).

As another example, while a dielectric function that varies spatially according to a pattern has been described in which the pattern is formed of holes, the pattern can also be formed in other ways. For example, a pattern can be formed continuous veins and/or discontinuous veins in the appropriate layer. Further, the pattern in varying dielectric function can be achieved without using holes or veins. For example, materials having different dielectric functions can be patterned in the appropriate layer. Combinations of such patterns can also be used.

As a further example, while layer 132 has been described as being formed of silver, other materials can also be used. In some embodiments, layer 126 is formed of a material that can reflect at least about 50% of light generated by the light-generating region that impinges on the layer of reflective material, the layer of reflective material being between the support and the multi-layer stack of materials. Examples of such materials include distributed Bragg reflector stacks and various metals and alloys, such as aluminum and aluminum-containing alloys.

As another example, a submount can be formed of a variety of materials. Examples of materials from which a submount can be formed include copper, copper-tungsten, aluminum nitride, silicon carbide, beryllium-oxide, diamonds, TEC and aluminum.

As an additional example, while layer 132 has been described as being formed of a heat sink material, in some embodiments, a light-emitting device can include a separate layer (e.g., disposed between layer 132 and a submount) that serves as a heat sink. In such embodiments, layer 132 may or may not be formed of a material that can serve as a heat sink.

As a further example, while the varying pattern in dielectric function has been described as extending into n-doped layer 135 only (which can substantially reduce the likelihood of surface recombination carrier losses) in addition to making use of the entire light-generating region, in some embodiments, the varying pattern in dielectric function can extend beyond n-doped layer (e.g., into a current spreading layer, light-generating region 134, and/or p-doped layer 123).

As another example, while embodiments have been described in which air can be disposed between surface 138 and a cover slip, in some embodiments materials other than, or in an addition to, air can be disposed between surface 138 and the cover slip. Generally, such materials have an index of refraction of at least about one and less than about 1.5 (e.g., less than about 1.4, less than about 1.3, less than about 1.2, less than about 1.1). Examples of such materials include nitrogen, air, or some higher thermal conductivity gas. In such embodiments, surface 138 may or may not be patterned. For example, surface 138 may be non-patterned but may be roughened (e.g., having randomly distributed features of various sizes and shapes less than $\lambda/5$).

As another example, while embodiments involving the deposition and etching of planarization and lithography layers have been described, in some embodiments, a pre-patterned etch mask can be laid down on the surface of the n-doped semiconductor layer.

As a further example, in some embodiments, an etch mask layer can be disposed between the n-doped semiconductor layer and the planarization layer. In such embodiments, the method can include removing at least a portion of the etch mask layer (e.g., to form a pattern in the etch stop layer corresponding to the pattern in the n-doped semiconductor layer).

As an additional example, while embodiments, have been disclosed in which surface 138 is patterned and smooth, in some embodiments, surface 138 may be patterned and rough (e.g., having randomly distributed features of various sizes and shapes less than $\lambda/5$, less than $\lambda/2$, less than $\lambda$). Further, in certain embodiments, the sidewalls of openings 139 can be rough (e.g., having randomly distributed features of various sizes and shapes less than $\lambda/5$, less than $\lambda/2$, less than $\lambda$), with or without surface 138 being rough. Moreover, in some embodiments, the bottom surface of openings 139 can be rough (e.g., having randomly distributed features of various sizes and shapes less than $\lambda/5$, less than $\lambda/2$, less than $\lambda$). Surface 138, the sidewalls of openings 139, and/or the bottom surfaces of openings 139 can be roughened, for example, by etching (e.g., wet etching, dry etching, reactive ion etching). Without wishing to be bound by theory, it is believed that roughening surface 138 and/or the sidewalls of openings 139 may increase the probability, with respect to a atomically smooth surface, that a light ray will eventually strike at an angle that less than the critical angle given by Snell's law and will be extracted.

As another example, in some embodiments, the submount can be machined to include spring-like structures. Without wishing to be bound by theory, it is believed that such spring-like structures may reduce cracking during removal of the substrate.

As a further example, in some embodiments, the submount can be supported by an acoustically absorbing platform (e.g., a polymer, a metallic foam). Without wishing to be bound by theory, it is believed that such acoustically absorbing structures may reduce cracking during removal of the substrate.

As an additional example, in some embodiments, the substrate is treated (e.g., etched, ground, sandblasted) before being removed. In certain embodiments, the substrate may be patterned before it is removed. In some embodiments, the thickness of the layers is selected so that, before removing the substrate and buffer layers, the neutral mechanical axis of the multi-layer stack is located substantially close (e.g., less than about 500 microns, less than about 100 microns, less than about 10 microns, less than about five microns) to the interface between the p-doped semiconductor layer and a bonding layer. In certain embodiments, portions of the substrate are separately removed (e.g., to reduce the likelihood of cracking).

As a further example, while embodiments have been described in which a substrate is removed by a process that includes exposing a surface of the substrate to electromagnetic radiation (e.g., laser light), in some embodiments other methods can be used to remove the substrate. For example, removal of the substrate can involve etching and/or lapping the substrate. In certain embodiments, the substrate can be etched and/or lapped, and then subsequently exposed to electromagnetic radiation (e.g., laser light).

As an additional example, in some embodiments, after depositing the planarization layer but before depositing the lithography layer, the upper surface of the planarization layer can be flattened. For example, a flat object, such as an optical flat, can be placed on the upper surface of the planarization layer while heating the planarization layer (e.g., with a hot plate). In some embodiments, a pressure can be applied (e.g., using a physical weight or press) to assist with the flattening process.

As another example, in some embodiments the substrate can be treated before being removed. For example, the substrate can be exposed to one or more processes selected from etching, polishing, grinding and sandblasting. In certain embodiments, treating the substrate can include patterning the substrate. In some embodiments, treating the substrate includes depositing an antireflective coating on the substrate. Such an antireflective coating can, for example, allow relatively large regions of the substrate to be removed when using a substrate removal process that involves exposing the substrate to electromagnetic radiation because the coating can reduce reflection of the electromagnetic radiation. In certain embodiments, a pattern on the surface of the substrate can also be used to achieve an anti-reflection effect.

In some embodiments, a light-emitting device can include a layer of a wavelength converting region (e.g., a material including one or more phosphor materials and/or one or more types of quantum dots) coated on surface 138 and/or a cover layer (e.g., a transparent window). In certain embodiments, a light-emitting device can include a cover layer (e.g., a transparent window) that has a wavelength converting material (e.g., a material including one or more phosphor materials and/or one or more types of quantum dots) disposed therein. In such embodiments, surface 138 may or may not be patterned.

In an alternative implementation, the light emitted by the light-generating region is UV (or violet, or blue) and the wavelength converting material includes a mixture of a red phosphor material (e.g., $L_2O_2S:Eu^{3+}$), a green phosphor material (e.g, ZnS:Cu,Al,Mn), and blue phosphor material (e.g, $(Sr,Ca,Ba,Mg)_{10}(PO_4)_6Cl:Eu^{2+}$).

As used herein, when a structure (e.g., layer, region) is referred to as being "on", "over" "overlying" or "supported by" another structure, it can be directly on the structure, or an intervening structure (e.g., layer, region) also may be present. A structure that is "directly on" or "in contact with" another structure means that no intervening structure is present.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

The invention claimed is:

1. A method of making a light emitting device, the method comprising:
   providing a first multi-layer stack, comprising:
      a substrate,
      a submount,
      a high bandgap buffer region between the substrate and the submount, wherein the buffer region includes a dislocation reduction region wherein the first multi-layer stack includes an n-doped region formed directly on the buffer region; and
      a sacrificial portion between the buffer region and the submount wherein the n-doped region comprises the sacrificial portion; and
   exposing the sacrificial portion to electromagnetic radiation to at least partially decompose the sacrificial portion; and
   removing the substrate and at least part of the buffer region from the first multi-layer stack to form a second multi-layer stack,
   wherein the substrate and the buffer region are transparent to wavelengths of the electromagnetic radiation.

2. The method of claim 1, wherein the dislocation reduction region has a varying composition across a thickness of the region.

3. The method of claim 1, wherein the electromagnetic radiation has a wavelength of smaller than 250 nm.

4. The method of claim 1, wherein the buffer region further comprises an AlN layer.

5. The method of claim 1, wherein the n-doped region is less than 1000 nm thick.

6. The method of claim 1, wherein the n-doped region is less than 500 nm thick.

7. The method of claim 1, wherein the second multi-layer stack comprises the n-doped region at an upper surface of the second multi-layer stack.

8. The method of claim 1, wherein the multilayer stack comprises a light generating region.

9. The method of claim 1, wherein the sacrificial portion comprises a semiconductor material.

10. The method of claim 1, wherein the decomposing the sacrificial portion comprises forming a gas and a liquid.

11. The method of claim 1, wherein the substrate is formed of AlN.

* * * * *